US010854664B2

(12) United States Patent
Yamamoto et al.

(10) Patent No.: US 10,854,664 B2
(45) Date of Patent: Dec. 1, 2020

(54) SOLID-STATE IMAGE PICKUP DEVICE AND METHOD FOR MANUFACTURING THE SAME, AND ELECTRONIC APPARATUS

(71) Applicant: SONY SEMICONDUCTOR SOLUTIONS CORPORATION, Kanagawa (JP)

(72) Inventors: Atsushi Yamamoto, Kanagawa (JP); Kunihiko Hikichi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/325,298

(22) PCT Filed: Aug. 29, 2017

(86) PCT No.: PCT/JP2017/030856
§ 371 (c)(1),
(2) Date: Feb. 13, 2019

(87) PCT Pub. No.: WO2018/047665
PCT Pub. Date: Mar. 15, 2018

(65) Prior Publication Data
US 2019/0206925 A1    Jul. 4, 2019

(30) Foreign Application Priority Data

Sep. 12, 2016  (JP) ................. 2016-177334

(51) Int. Cl.
*H01L 27/146* (2006.01)
*G02B 5/02* (2006.01)
(Continued)

(52) U.S. Cl.
CPC ........ *H01L 27/14685* (2013.01); *G02B 1/118* (2013.01); *G02B 3/00* (2013.01);
(Continued)

(58) Field of Classification Search
CPC ......... H01L 27/14685; H01L 27/14627; H01L 27/14623; H01L 27/14625; H01L 27/14618; H01L 27/14629; G02B 1/118
(Continued)

(56) References Cited

U.S. PATENT DOCUMENTS

2003/0086013 A1   5/2003  Aratani
2009/0230494 A1   9/2009  Takizawa
(Continued)

FOREIGN PATENT DOCUMENTS

CN    106068563 A    11/2016
JP    2001-171429 A   6/2001
(Continued)

OTHER PUBLICATIONS

English Machine translation of Japanese Patent JP 2002-171429 A by Kato Yukihide Date Jun. Year 2002.*
(Continued)

*Primary Examiner* — Thinh T Nguyen
(74) *Attorney, Agent, or Firm* — Chip Law Group

(57) ABSTRACT

The present disclosure relates to a solid-state image pickup device and a method for manufacturing the same, and an electronic apparatus, capable of suppressing color mixture, stray light, reduction in contour resolution, and the like. A solid-state image pickup device includes: a light shielding body having light shielding walls and a light transmitting portion formed in an opening portion between the light shielding walls; a first light shielding layer which is formed on an incident surface side of light of the light shielding body, and has an opening portion narrower than the opening portion of the light shielding body for each of the opening portions of the light shielding body; a microlens provided on the incident surface side of light of the light shielding body and for each of the opening portions of the first light
(Continued)

shielding layer; a light receiving element layer in which a large number of light receiving elements which perform photoelectric conversion in accordance with incident light condensed by the microlens and input via the light transmitting portion of the light shielding body are arranged; and a second light shielding layer which is formed on the light receiving element layer side of the light shielding body, and has an opening portion narrower than the opening portion of the light shielding body and wider than the first light shielding layer for each of the opening portions of the light shielding body. The present disclosure can be used for a compound eye optical system, for example.

8 Claims, 18 Drawing Sheets

(51) Int. Cl.
  *G02B 5/00* (2006.01)
  *G02B 3/00* (2006.01)
  *G02B 1/118* (2015.01)
(52) U.S. Cl.
  CPC .............. *G02B 5/00* (2013.01); *G02B 5/02* (2013.01); *H01L 27/146* (2013.01); *H01L 27/14623* (2013.01); *H01L 27/14625* (2013.01); *H01L 27/14627* (2013.01); *H01L 27/14629* (2013.01); *H01L 27/14618* (2013.01)
(58) Field of Classification Search
  USPC ....... 257/291, 292, 435, 436; 438/48, 69, 70
  See application file for complete search history.

(56) References Cited

U.S. PATENT DOCUMENTS

| | | | |
|---|---|---|---|
| 2015/0103226 | A1 | 4/2015 | Takahashi et al. |
| 2016/0367144 | A1* | 12/2016 | Matsuo ................ A61B 5/0059 |
| 2017/0338265 | A1* | 11/2017 | Yoshiba et al. ... H01L 27/14623 |

FOREIGN PATENT DOCUMENTS

| | | | |
|---|---|---|---|
| JP | 2002-171429 A | 6/2002 |
| JP | 2003-143459 A | 5/2003 |
| JP | 2005-031460 A | 2/2005 |
| JP | 2005-072662 A | 3/2005 |
| JP | 2009-218382 A | 9/2009 |
| JP | 2010-014857 A | 1/2010 |
| JP | 2010-219571 A | 9/2010 |
| JP | 2012-195758 A | 10/2012 |
| JP | 2015-082566 A | 4/2015 |
| JP | 2015-099345 A | 5/2015 |
| JP | 2012-195758 A | 7/2016 |
| KR | 10-2017-0103624 A | 9/2017 |
| WO | 2009/008168 A1 | 1/2009 |
| WO | 2016/114154 A1 | 7/2016 |
| WO | 2016/114154 A1 | 7/2017 |

OTHER PUBLICATIONS

International Search Report and Written Opinion of PCT Application No. PCT/JP2017/030856, dated Nov. 21, 2017, 10 pages of ISRWO.

* cited by examiner

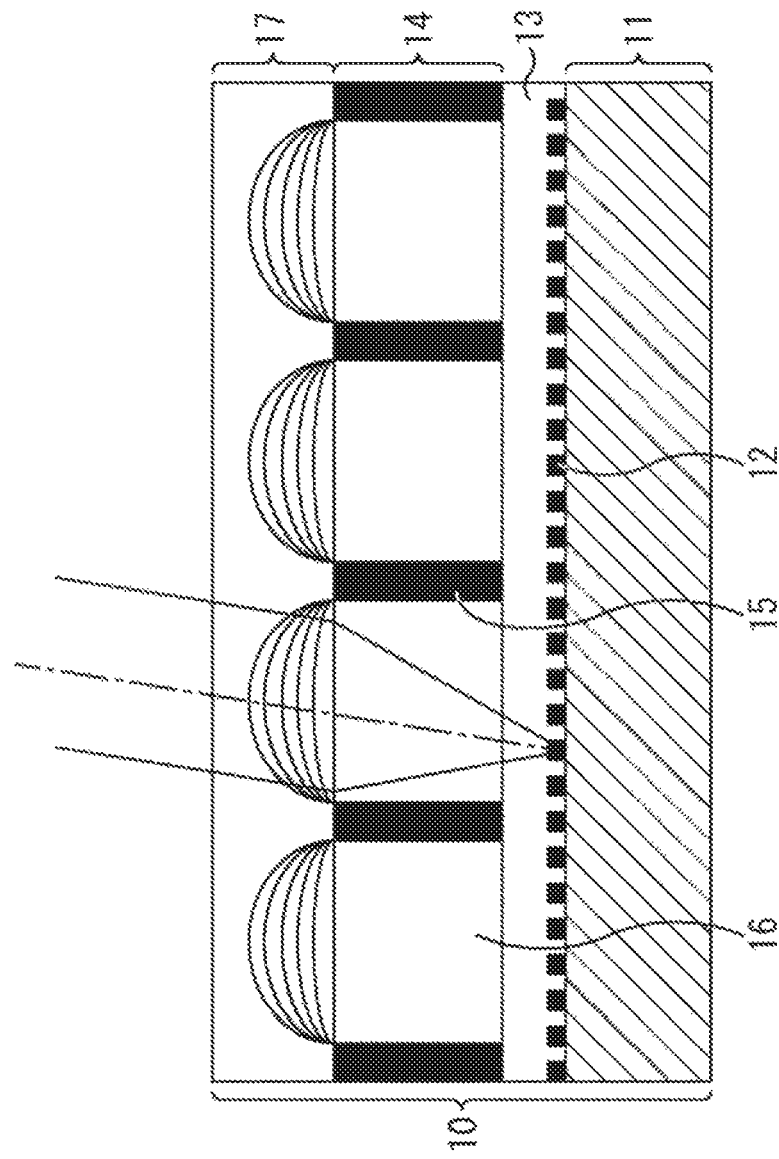

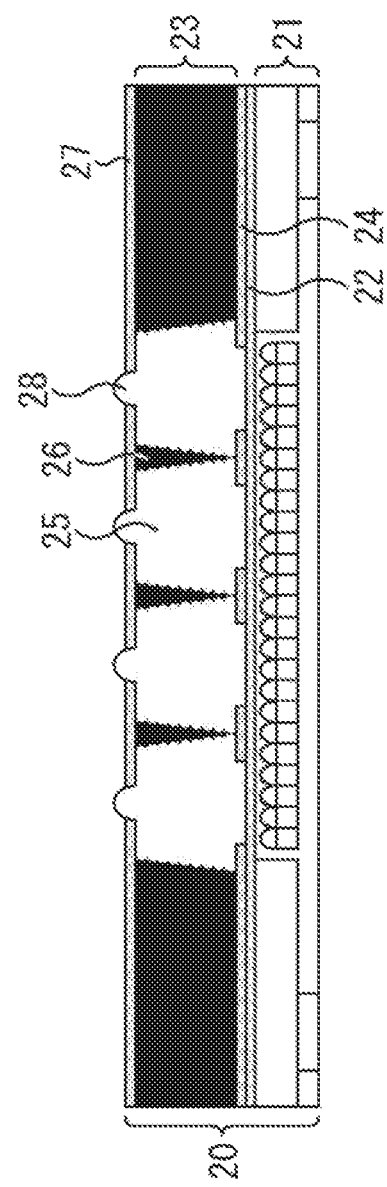

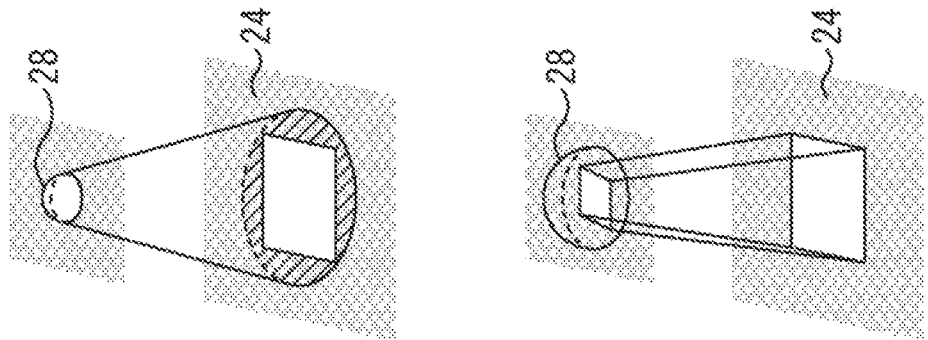
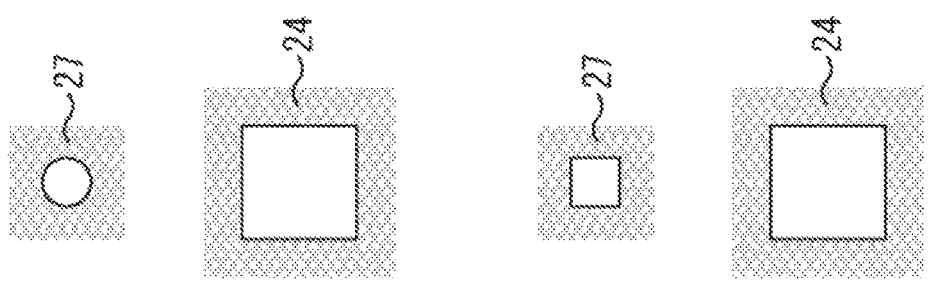
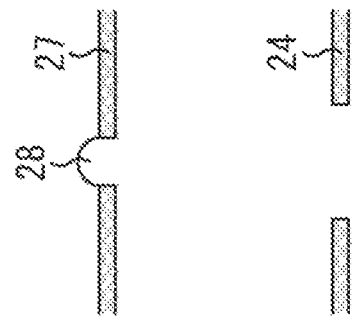
FIG. 16A
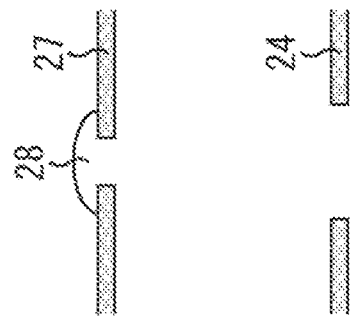
FIG. 16B

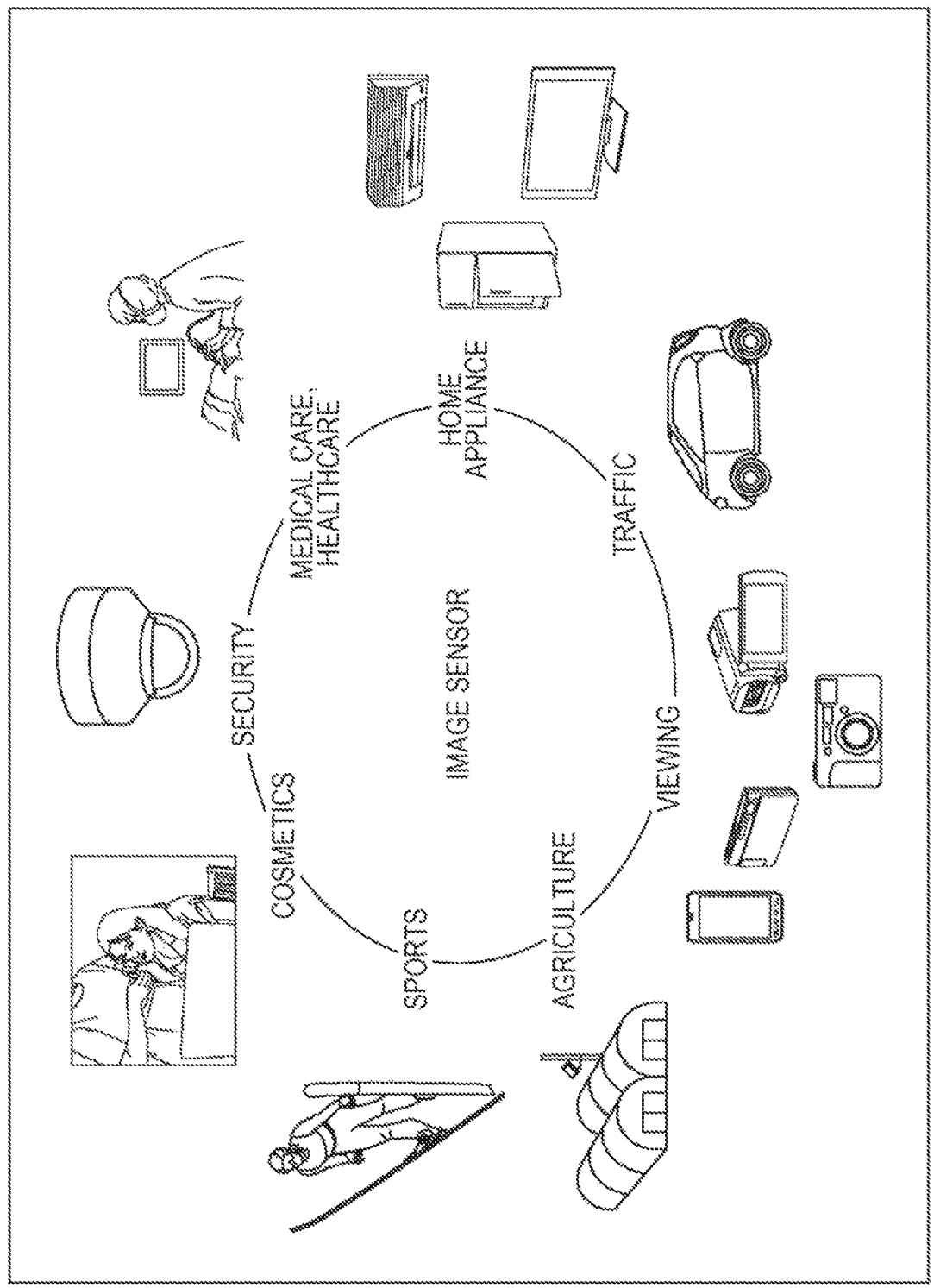

SOLID-STATE IMAGE PICKUP DEVICE AND METHOD FOR MANUFACTURING THE SAME, AND ELECTRONIC APPARATUS

CROSS REFERENCE TO RELATED APPLICATIONS

This application is a U.S. National Phase of International Patent Application No. PCT/JP2017/030856 filed on Aug. 29, 2017, which claims priority benefit of Japanese Patent Application No. JP 2016-177334 filed in the Japan Patent Office on Sep. 12, 2016. Each of the above-referenced applications is hereby incorporated herein by reference in its entirety.

TECHNICAL FIELD

The present disclosure relates to a solid-state image pickup device and a method for manufacturing the same, and an electronic apparatus, and in particular, to a solid-state image pickup device suitable for use in a compound eye optical system and a method for manufacturing the same, and an electronic apparatus, for example.

BACKGROUND ART

In related art, for example, as an image sensor used in the compound eye optical system, a configuration in which a light shielding body is provided between a microlens and a light receiving element has been known (see, for example, Patent Document 1).

FIG. 1 illustrates an example of the configuration of the conventional image sensor in which the light shielding body is provided between the microlens and the light receiving element.

An image sensor 10 is configured by stacking a light receiving element layer 11, a transparent insulating layer 13, a light shielding body 14, and a microlens array 17. The light receiving element layer 11 includes a large number of light receiving elements 12 disposed vertically and horizontally. The light shielding body 14 includes a light transmitting portion 16 in which a photopolymerizable resin through which light is transmitted is formed in a columnar shape by lithography, and a light shielding wall 15 formed by filling a black pigment resin between the light transmitting portions 16. A microlens array 17 is formed such that one microlens is disposed with respect to each opening portion (the light transmitting portion 16 surrounded by the light shielding wall 15) of the light shielding body 14, and a cover glass or the like is stacked on the microlens for planarization.

According to the image sensor 10, the incident light condensed by the microlens array 17 can be made incident on the light receiving element 12 just below the light transmitting portion 16, via the light transmitting portion 16 surrounded by the light shielding wall 15. In addition, since the light shielding body 14 is disposed, it is possible to prevent the condensed incident light from leaking to the light receiving element of an adjacent section. Furthermore, since the light transmitting portion 16 is disposed between the light shielding walls 15 forming the light shielding body 14, it is possible to prevent dew condensation from occurring on the side surface of the light shielding wall 15 due to environmental changes such as a temperature change.

CITATION LIST

Patent Document

Patent Document 1: Japanese Patent Application Laid-Open No. 2005-72662

SUMMARY OF THE INVENTION

Problems to be Solved by the Invention

As described above, although the leakage of incident light is suppressed by disposing the light shielding body 14 in the image sensor 10, the image sensor 10 is still susceptible to the influence of color mixture and stray light.

Further, the positions of the light shielding wall 15 and the light transmitting portion 16 constituting the light shielding body 14 of the image sensor 10 are determined by forming the photopolymerizable resin in a column shape by lithography. However, because the thickness of the photopolymerizable resin forming the light transmitting portion 16 is relatively thick, it is difficult to increase the formation accuracy of the light transmitting portion 16, and it is difficult to form the light transmitting portion 16 in an ideal rectangular shape.

This may cause problems in the case of connecting images obtained from the light receiving element 12 just below each microlens. This problem will be described with reference to FIGS. 2A and 2B.

FIG. 2A is a bird's-eye view when the light shielding body 14 of the image sensor 10 is viewed from the light incident side. As illustrated in FIG. 2A, the light transmitting portion 16 has a low rectangularity. Further, as illustrated in FIG. 2B, since the image obtained by forming an image of the incident light transmitted through the light transmitting portion 16 having a low rectangularity on the light receiving element also has a low rectangularity, its contour resolution decreases, which makes it difficult to synthesize images in the vicinity of the contour.

The present disclosure has been made in view of such circumstances, and makes it possible to suppress color mixture, stray light, degradation of contour resolution, and the like which may occur in the solid-state image pickup device having a structure in which the light shielding body is disposed on the light receiving element layer.

Solutions to Problems

A solid-state image pickup device of a first aspect of the present disclosure includes: a light shielding body having light shielding walls and a light transmitting portion formed in an opening portion between the light shielding walls; a first light shielding layer which is formed on an incident surface side of light of the light shielding body, and has an opening portion narrower than the opening portion of the light shielding body for each of the opening portions of the light shielding body; a microlens provided on the incident surface side of light of the light shielding body and for each of the opening portions of the first light shielding layer; a light receiving element layer in which a large number of light receiving elements which perform photoelectric conversion in accordance with incident light condensed by the microlens and input via the light transmitting portion of the light shielding body are arranged; and a second light shielding layer which is formed on the light receiving element layer side of the light shielding body, and has an opening portion narrower than the opening portion of the light shielding body and wider than the first light shielding layer for each of the opening portions of the light shielding body.

A method for manufacturing a solid-state image pickup device of a second aspect of the present disclosure includes: forming a first light shielding layer having an opening portion narrower than an opening portion of a light shielding body for each of the opening portions of the light shielding body, on an incident surface side of light of the light shielding body having light shielding walls and a light transmitting portion formed in an opening portion between the light shielding walls; forming a microlens on the incident surface side of light of the light shielding body and for each of the opening portions of the first light shielding layer; and forming a second light shielding layer narrower than the opening portion of the light shielding body and wider than the first light shielding layer for each of the opening portions of the light shielding body, on the light receiving element layer side of the light shielding body.

An electronic apparatus of a third aspect of the present disclosure includes a solid-state image pickup device, the solid-state image pickup device including: a light shielding body having light shielding walls and a light transmitting portion formed in an opening portion between the light shielding walls; a first light shielding layer which is formed on an incident surface side of light of the light shielding body and has an opening portion narrower than the opening portion of the light shielding body for each of the opening portions of the light shielding body; a microlens provided on the incident surface side of light of the light shielding body and for each of the opening portions of the first light shielding layer; a light receiving element layer in which a large number of light receiving elements which perform photoelectric conversion in accordance with incident light condensed by the microlens and input via the light transmitting portion of the light shielding body are arranged; and a second light shielding layer which is formed on the light receiving element layer side of the light shielding body, and has an opening portion narrower than the opening portion of the light shielding body and wider than the first light shielding layer for each of the opening portions of the light shielding body.

In the first to third aspects of the present disclosure, on an incident surface side of light of a light shielding body having light shielding walls and a light transmitting portion formed in an opening portion between the light shielding walls, a first light shielding layer having an opening portion narrower than the opening portion of the light shielding body for each of the opening portions of the light shielding body is formed, a microlens is formed on the incident surface side of light of the light shielding body and for each of the opening portions of the first light shielding layer, and, on the light receiving element layer side of the light shielding body, a second light shielding layer having an opening portion narrower than the opening portion of the light shielding body and wider than the first light shielding layer for each of the opening portions of the light shielding body is formed.

Effects of the Invention

According to the first to third aspects of the present disclosure, it is possible to suppress problems such as color mixture, stray light, and degradation of contour resolution which may occur in the solid-state image pickup device having a structure in which the light shielding body is disposed on the light receiving element layer.

Further, the effects described herein are not necessarily limited, and may be any of the effects described in the present disclosure.

BRIEF DESCRIPTION OF DRAWINGS

FIG. 1 is a cross-sectional view illustrating an example of a configuration of a conventional image sensor.

FIG. 15 is a cross-sectional view illustrating a modified example of the fifth configuration example.

FIGS. 16A and 16B are views describing an opening shape of the upper side light shielding layer.

FIG. 18 is a diagram describing a usage example of the image sensor to which the present disclosure is applied.

MODE FOR CARRYING OUT THE INVENTION

Hereinafter, best modes (hereinafter referred to as embodiments) for implementing the present disclosure will be described in detail with reference to the drawings.

Figure 3:
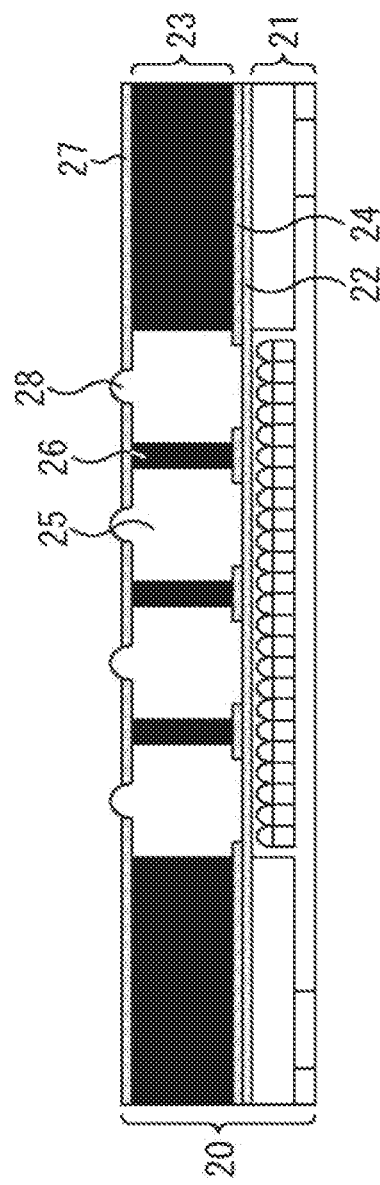
FIG. 3 is a cross-sectional view illustrating a configuration example of an image sensor to which the present disclosure is applied.

First Configuration Example of Image Sensor which is Embodiment of Present Disclosure FIG. 3 illustrates a first configuration example of an image sensor which is an embodiment of the present disclosure.

An image sensor 20 is, for example, a solid-state image pickup device used for a compound eye optical system, and is formed by joining a light receiving element layer 21 and a light shielding body 23 separately generated with a thin film joining resin layer 22. By joining the light receiving element layer 21 and the light shielding body 23 with no gap by the thin film joining resin layer 22, it is possible to prevent a dew condensation which may occur in the gap in the past. Therefore, deterioration of the obtained image can be suppressed.

The light receiving element layer 21 includes a large number of light receiving elements arranged vertically and horizontally. The thin film joining resin layer 22 includes a transparent material and is arranged to join the light receiving element layer 21 and the light shielding body 23 with no gap.

The light shielding body 23 includes a light shielding wall 26 including a light shielding material such as Si, and a light transmitting portion 25 including a transparent material such as glass or resin. The light shielding wall 26 is formed by opening penetration holes in the light shielding material by processing such as lithography and dry etching. The light transmitting portion 25 is formed by filling a space between the light shielding walls 26 (that is, penetration holes) with a transparent material.

That is, the opening portion surrounded by the light shielding wall 26 serves as the light transmitting portion 25, and the light shielding body 23 is formed to transmit the light incident from an upper side (an incident surface side of light) to a lower side (a light receiving element side).

A lower side light shielding layer 24 is formed on the lower side of the light shielding body 23. The lower side light shielding layer 24 includes a light shielding material such as a black color filter (BLK CF), Ti, and W, and has a rectangular opening portion narrower than each opening portion (the light transmitting portion 25 surrounded by the light shielding wall 26) of the light shielding body 23.

On the other hand, an upper side light shielding layer 27 is formed on the upper side of the light shielding body 23. The upper side light shielding layer 27 includes a light shielding material such as BLK CF, Ti, and W, and has a circular opening portion narrower than each opening portion (the light transmitting portion 25 surrounded by the light shielding wall 26) of the light shielding body 23. A microlens 28 is formed in a circular opening portion of the upper side light shielding layer 27.

Figure 4A:
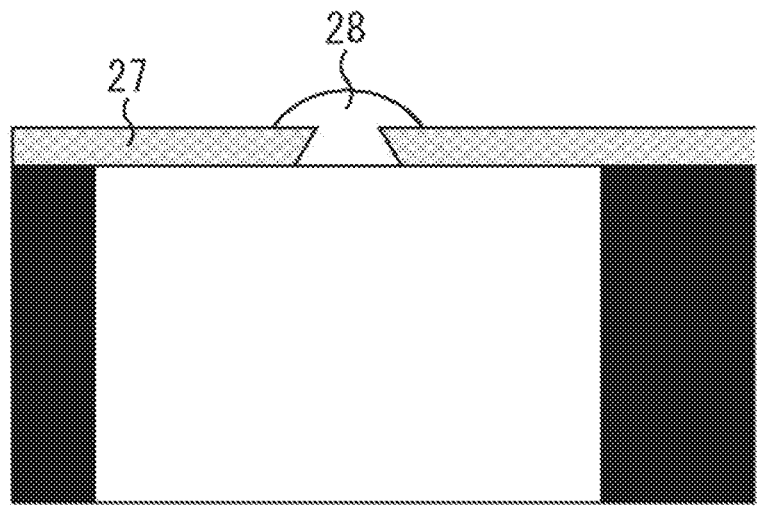
FIGS. 4A and 4B are views describing a shape of a wall surface of an opening portion provided on an upper side light shielding layer.
Figure 4B:
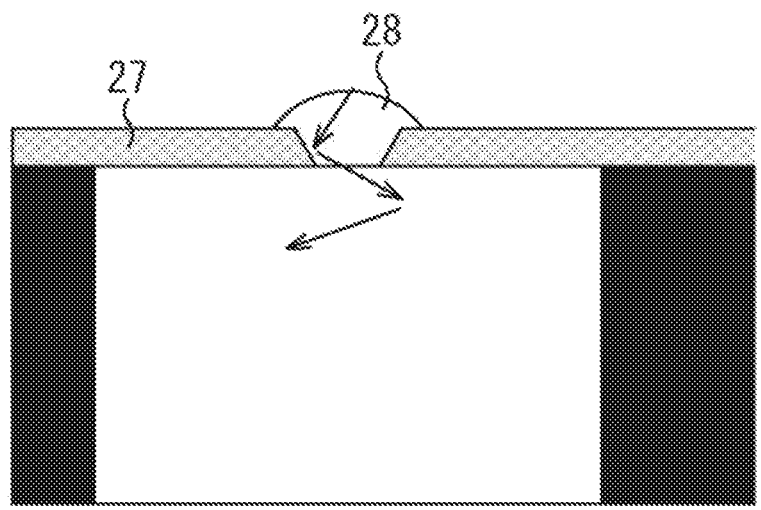

FIGS. 4A and 4B illustrate an example of the shape of the wall surface of the opening portion provided on the upper side light shielding layer 27.

FIG. 4A illustrates a case where the wall surface of the opening portion of the upper side light shielding layer 27 is processed in a downward direction (in a direction of the light receiving element) (this shape is referred to as an inversely tapered shape in this specification). In the case of the inversely tapered shape, occurrence of reflection of incident light on the wall surface of the opening portion of the upper side light shielding layer 27 is suppressed.

FIG. 4B illustrates a case where the wall surface of the opening portion of the upper side light shielding layer 27 is processed in an upward direction (in a microlens direction) (this shape is referred to as a tapered shape in this specification). In the case of the tapered shape, reflection of incident light occurs on the wall surface of the upper side light shielding layer 27, and stray light may be generated. Therefore, the wall surface shape of the opening portion of the upper side light shielding layer 27 is preferably set to an inversely tapered shape as illustrated in FIG. 4A or to a vertical shape (not illustrated), avoiding the tapered shape illustrated in FIG. 4B.

Further, note that the opening portion of the lower side light shielding layer 24 may be formed to have either a tapered shape or an inversely tapered shape. Of course, the opening portion may have a vertical shape with no inclination.

Next, a process of forming the upper side light shielding layer 27 and the microlens 28 will be described.

Figure 5A:
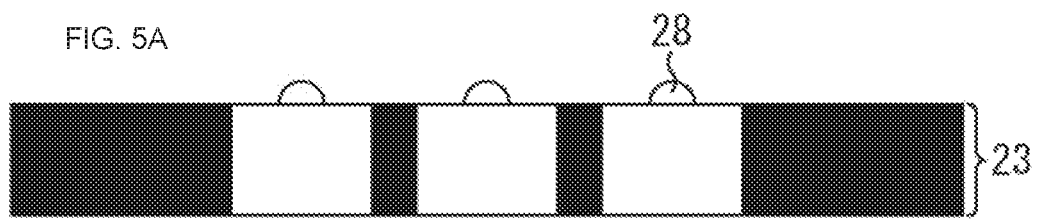
FIGS. 5A and 5B are views illustrating a process in the case of forming a microlens and the upper side light shielding layer.
Figure 5B:
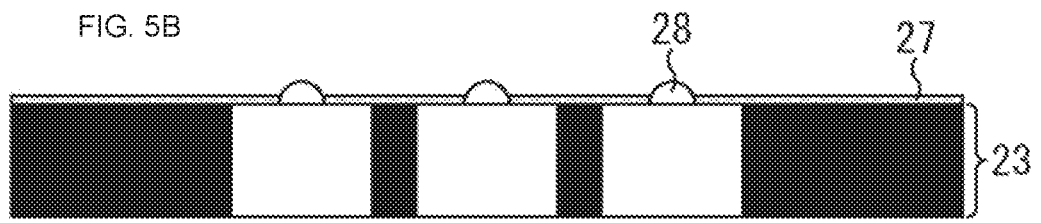
Figure 6A:
FIGS. 6A, 6B, and 6C are views illustrating a process of forming the microlenses.
Figure 6B:
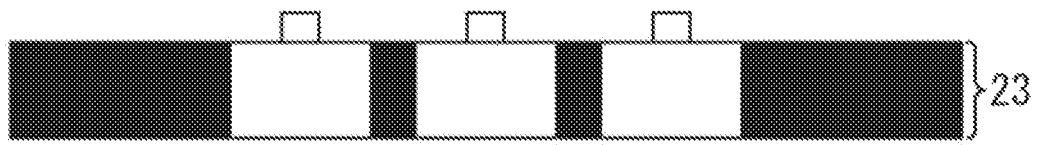
Figure 6C:
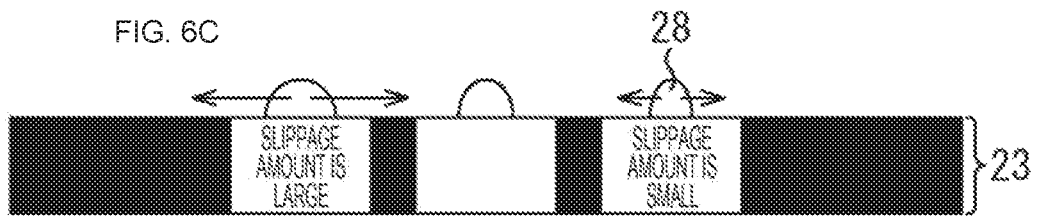

FIGS. 5A and 5B illustrate a process in a case where the microlens 28 is formed first and then the upper side light shielding layer 27 is formed. FIGS. 6A, 6B, and 6C illustrate details of the process of forming the microlens 28 in that case.

In the case of forming the microlens 28 before forming the upper side light shielding layer 27, as illustrated in FIG. 6B, a lens material is disposed on the light transmitting portion 25 of the light shielding body 23 by photolithography (PR), and as illustrated in FIG. 6C, the lens material is processed into the shape of the microlens 28 by a registry flow (heating).

In this case, since there is no upper side light shielding layer 27 for restricting the slippage around the lens material, variations occur in an amount of slippage, which may occur in the shape or the size of each microlens 28. As a result, there is a possibility that a failure such as bending may occur in the obtained image. In order to prevent such a failure, it is preferable that the microlens 28 be formed after forming the upper side light shielding layer 27.

Next, FIGS. 7A, 7B, 7C, 8A, 8B, 8C, 8D, and 8E illustrate manufacturing process in a case where the upper side light shielding layer 27 is formed first and then the microlens 28 is formed.

Further, in the example of FIGS. 7A, 7B, and 7C, a case where the lower side light shielding layer 24 and the upper side light shielding layer 27 are formed using BLK CF will be described.

Figure 7A:
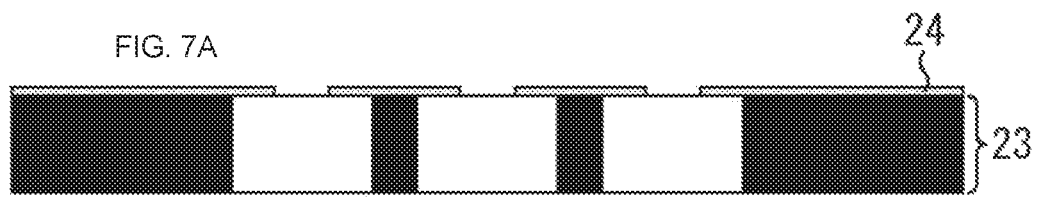
FIGS. 7A, 7B, and 7C are views illustrating a process in the case of forming the upper side light shielding layer and the microlens.

First, as illustrated in FIG. 7A, the lower side light shielding layer 24 is patterned on the lower side of the light shielding body 23, using photolithography (PR).

Figure 7B:
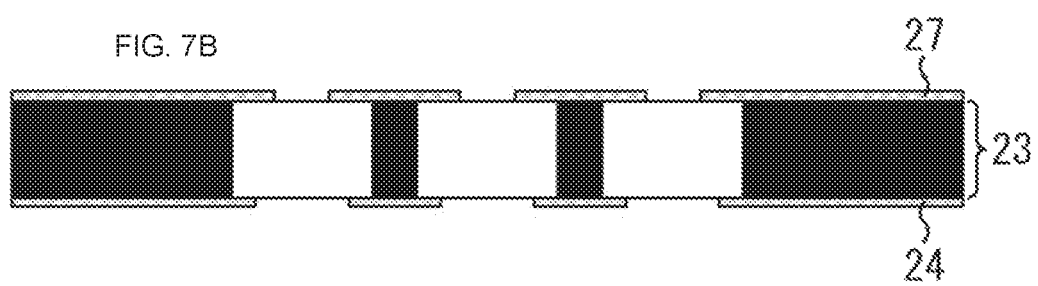
Figure 7C:
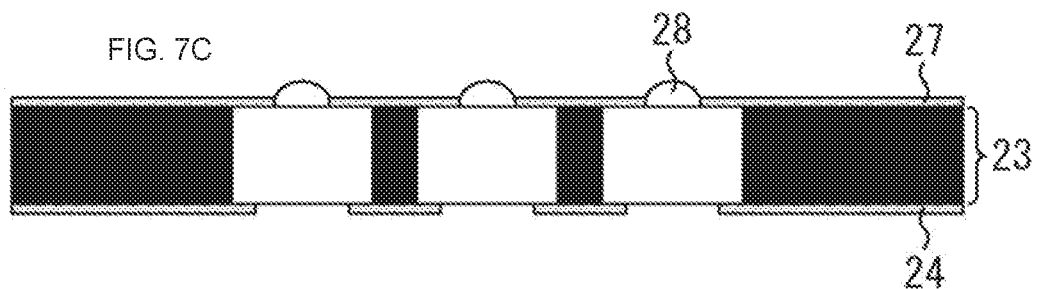

Next, the entire light shielding body 23 on which the lower side light shielding layer 24 is formed is reversed, and as illustrated in FIG. 7B, the BLK CF is applied by the PR and the upper side light shielding layer 27 is formed on the incident light side of the light shielding body 23. Thereafter, as illustrated in FIG. 7C, the microlens 28 is formed in the opening portion of the upper side light shielding layer 27.

Figure 8A:
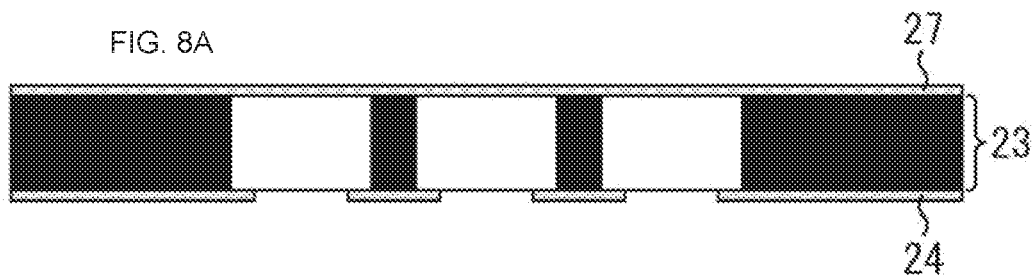
FIGS. 8A, 8B, 8C, 8D, and 8E are views illustrating a process in the case of forming the upper side light shielding layer and the microlens.
Figure 8B:
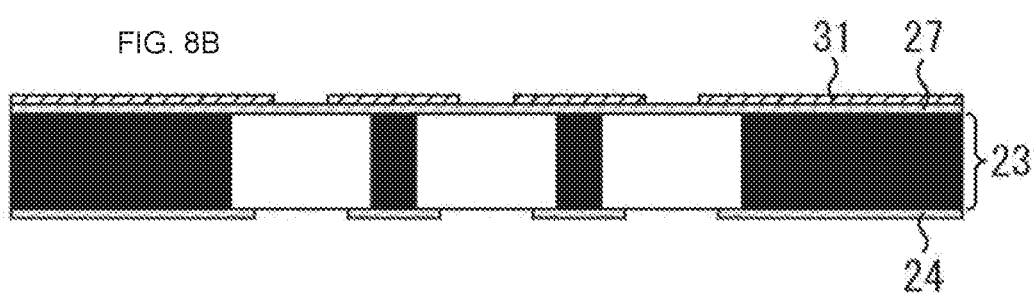
Figure 8C:
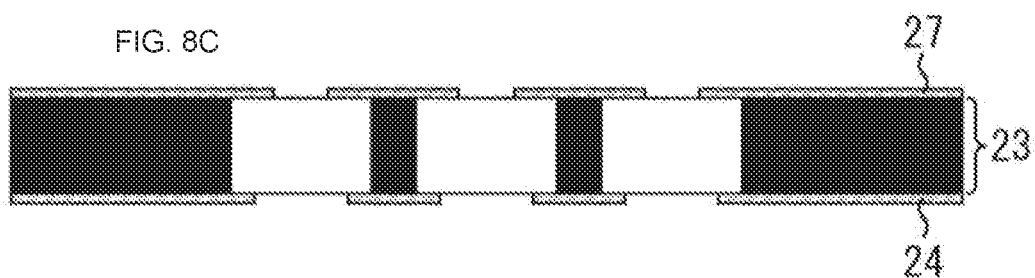

In contrast, in a case where the upper side light shielding layer 27 is formed using Ti or W, as illustrated in FIG. 8A, after Ti or the like is applied to the entire surface of a surface opposite to the surface on which the lower side light shielding layer 24 is formed, as illustrated in FIG. 8B, a resist covering a portion to be left as the upper side light shielding layer 27 is applied by the PR, and as illustrated in FIG. 8C, surplus Ti is removed by the dry etching or the like, thereby forming the upper side light shielding layer 27.

Figure 8D:
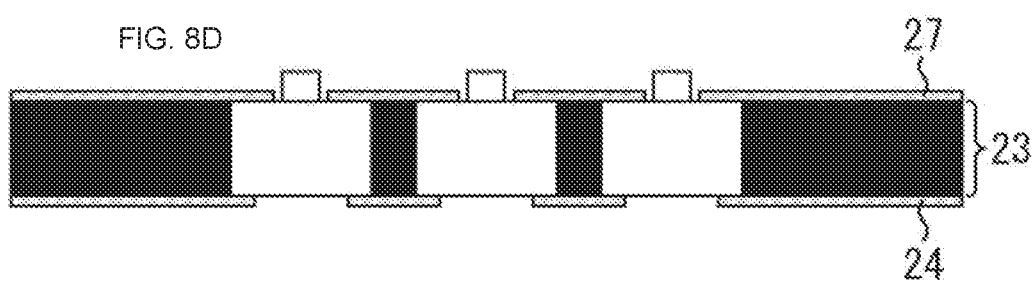
Figure 8E:
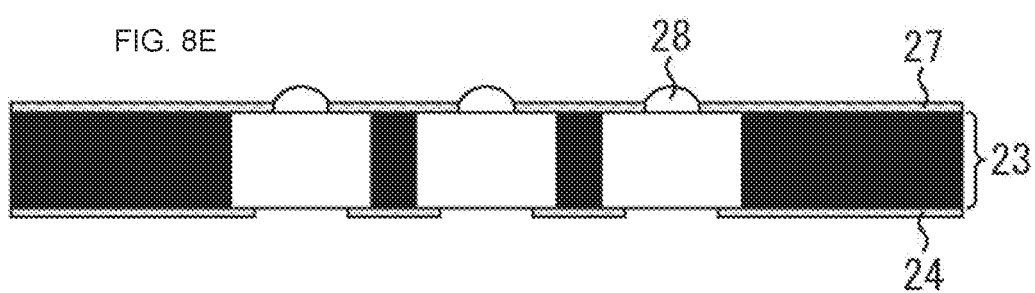

After forming the upper side light shielding layer 27, as illustrated in FIG. 8D, a lens material is disposed in the opening portion of the upper side light shielding layer 27 by the PR, and as illustrated in FIG. 8E, by performing the registry flow (heating), the disposed lens material is processed into the shape of the microlens 28.

In this case, since the upper side light shielding layer 27 for restricting the slippage is already formed around the lens material, the uniformity of the shape and size of each microlens 28 can be improved.

In the examples illustrated in FIGS. 7A, 7B, 7C, 8A, 8B, 8C, 8D, and 8E, after forming the lower side light shielding layer 24 on the light receiving element layer 21 side, the upper side light shielding layer 27 and the microlens 28 are formed. However, after the upper side light shielding layer 27 and the microlens 28 are formed, the lower side light shielding layer 24 may be formed. Further, even in a case where the lower side light shielding layer 24 is formed using Ti or W, it can be formed by the method similar to that of the upper side light shielding layer 27 described above.

Figure 9A:
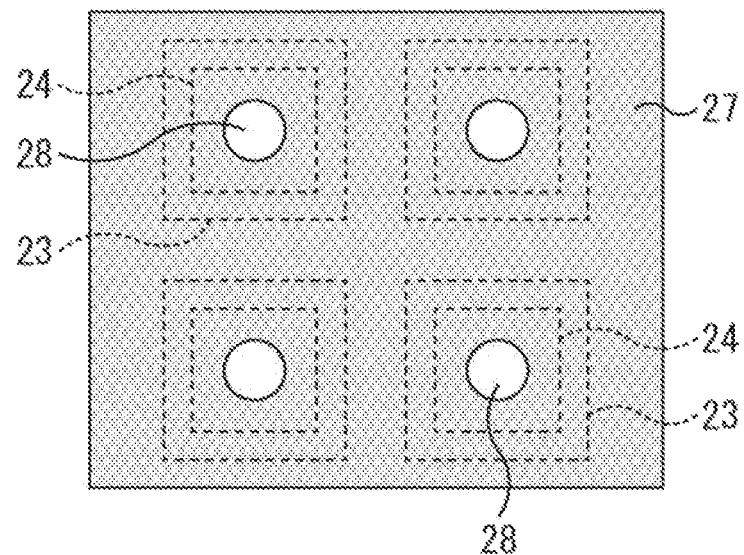
FIGS. 9A and 9B are diagrams describing an effect obtained by providing the upper side light shielding layer and a lower side light shielding layer.

FIG. 9A is a plan view of the image sensor 20 formed in this way as seen from the light incident side.

In the image sensor 20, the light condensed by the microlens 28 in which the periphery thereof is shielded by the upper side light shielding layer 27 transmits through the opening portion (the light transmitting portion 25) of the light shielding body 23 and the opening portion of the lower side light shielding layer 24 and is incident on the light receiving element layer 21.

Here, the opening portion (an opening size) of the upper side light shielding layer 27 has, for example, a circular shape having a diameter of 70 μm, the opening portion (an opening size) of the lower side light shielding layer 24 has, for example, a rectangular shape (a square shape) of 140 μm square, and the opening portion (an opening size) of the light shielding body 23 has, for example, a rectangular shape (a square shape) of 360 μm square. Therefore, the opening portion of the upper side light shielding layer 27 is smaller than the opening portion of the lower side light shielding layer 24.

Figure 2A:
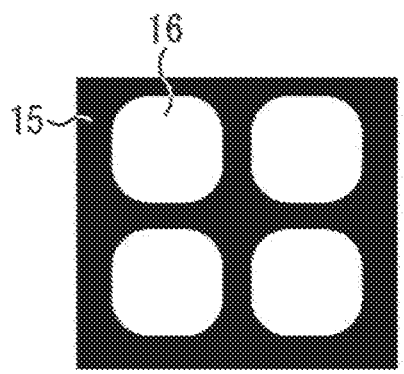
FIGS. 2A and 2B are diagrams describing problems of the image sensor of FIG. 1.
Figure 2B:
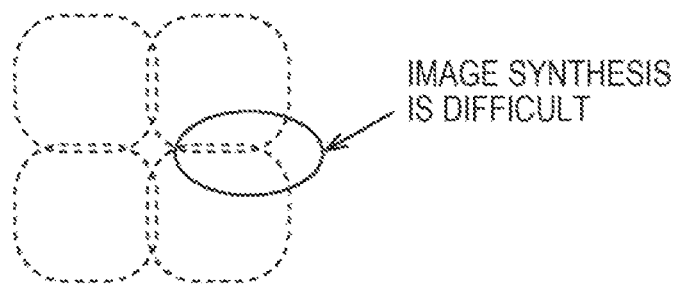
Figure 9B:
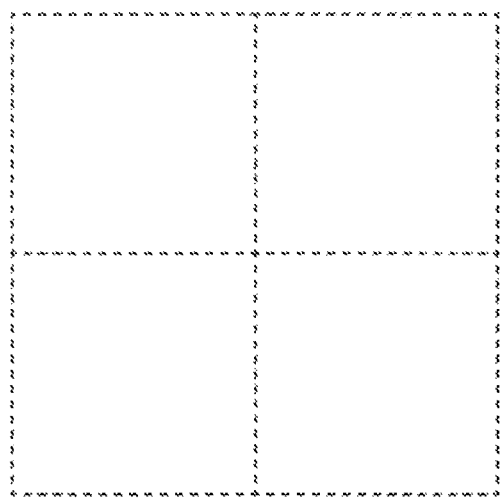

When the opening size is in such a relation, since the incident light transmits through the opening portion of the lower side light shielding layer 24 narrower than the opening portion of the light shielding body 23 and formed in a rectangular shape, it is possible to suppress the incident light from leaking to the adjacent section. Further, since the degradation of contour resolution of the image formed on the light receiving element is suppressed by the rectangular shape of the opening portion of the lower side light shielding layer 24 as illustrated in FIG. 9B, even in the case of synthesizing images obtained from adjacent sections of the light receiving element layer 21, image synthesis near the contour can be easily executed as compared with the case illustrated in FIG. 2B.

Second Configuration Example of Image Sensor 20 which is Embodiment of Present Disclosure As described above, the light transmitting portion 25 of the light shielding body 23 includes a transparent material such as glass or resin. However, in a case where the transparent material is a glass, α rays are emitted from the glass due to the additive thereof, and the light receiving element of the light receiving element layer 21 may be adversely affected.

Figure 10:
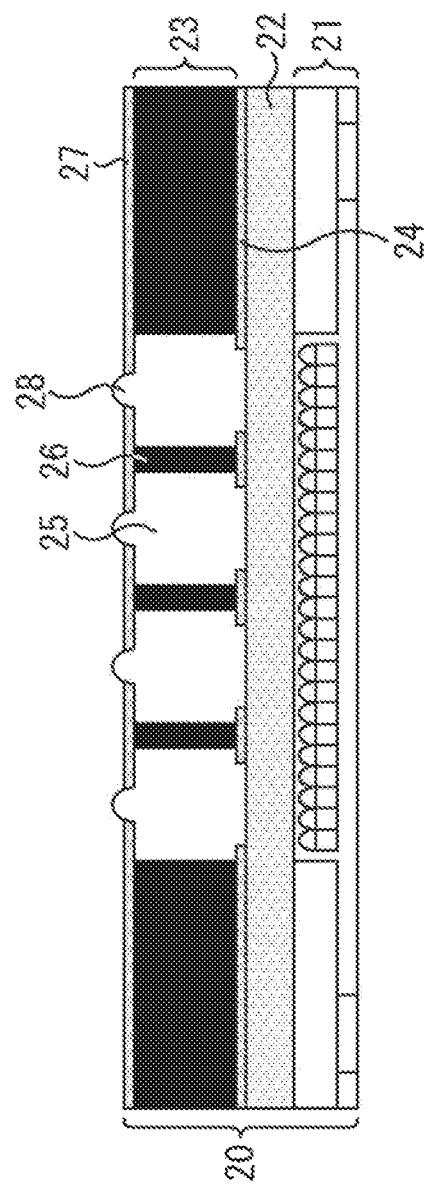
FIG. 10 is a cross-sectional view illustrating a second configuration example of the image sensor to which the present disclosure is applied.

Next, FIG. 10 illustrates a second configuration example of the image sensor 20 capable of suppressing this adverse effect.

In the second configuration example, the thickness of the thin film joining resin layer 22 for joining the light receiving element layer 21 and the light shielding body 23 is increased to shield the α rays. In this case, the thickness of the thin film joining resin layer 22 may be about 50 μm.

In the second configuration example, since the α ray emitted from the glass forming the light transmitting portion 25 of the light shielding body 23 are shielded by the thin film joining resin layer 22, it is possible to suppress the adverse effect of α rays on the light receiving element of the light receiving element layer 21.

However, in a case where the thickness of the thin film joining resin layer 22 is increased, problems described below may also occur.

Figure 11:
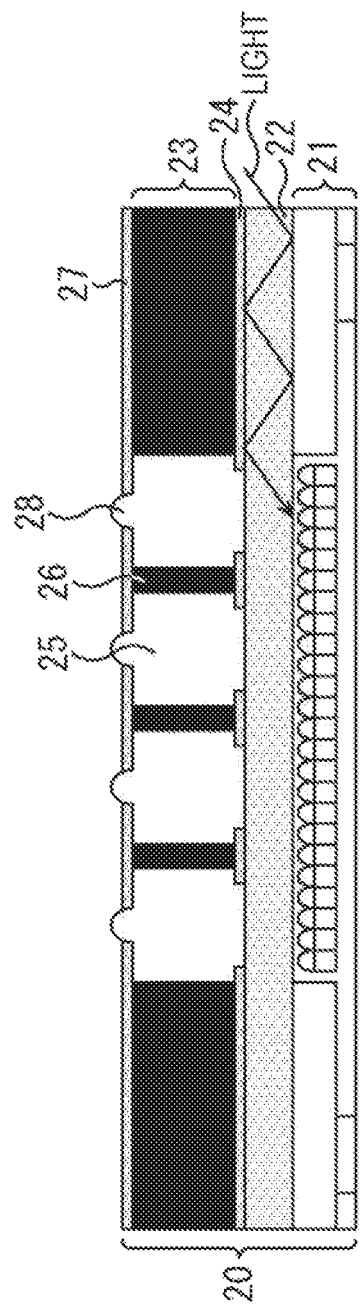
FIG. 11 is a view describing a problem of a second configuration example of the image sensor.

FIG. 11 illustrates problems that may occur in the second configuration example of the image sensor 20. In the case of increasing the thickness of the thin film joining resin layer 22, as illustrated in FIG. 11, light enters the thin film joining resin layer 22 from the side, the light is multiple-reflected within the thin film joining resin layer 22, and is incident on the light receiving element of the light receiving element layer 21, which causes deterioration of image quality such as ghost and flare.

Figure 12:
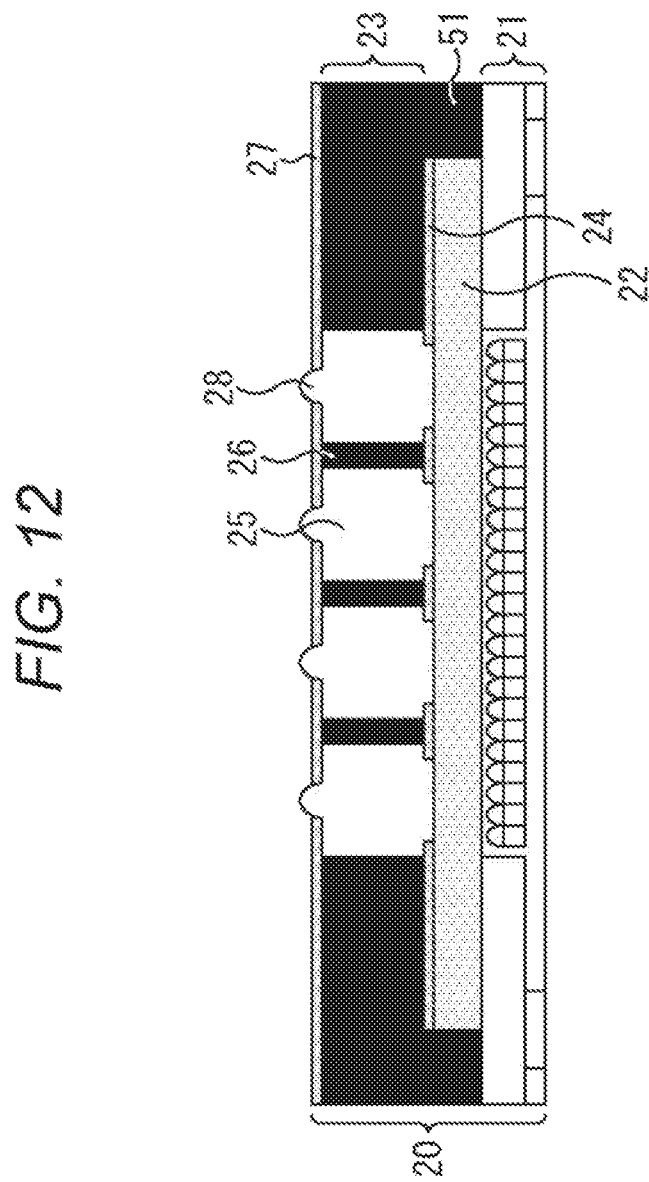
FIG. 12 is a cross-sectional view illustrating a third configuration example of the image sensor to which the present disclosure is applied.

Third Configuration Example of Image Sensor 20 which is Embodiment of Present Disclosure Next, FIG. 12 illustrates a third configuration example of the image sensor 20 that can prevent entry of light from the side of the thin film joining resin layer 22 having an increased thickness.

In the third configuration example, the light shielding wall 26 of the light shielding body 23 at the end of the image sensor 20 extends to the side of the thin film joining resin layer 22 to form a convex portion 51.

Regarding the process of forming the convex portion 51 on the light shielding body 23, before a penetration hole serving as the light transmitting portion 25 is opened in the light shielding material, a region serving as the convex portion 51 of the light shielding material is left, other regions may be dug down by the same amount as the thickness of the thin film joining resin layer 22 and then the penetration hole may be opened.

In the third configuration example, since the side of the joining resin layer 22 is shielded by the convex portion 51, it is possible to prevent light from entering from the side of the thin film joining resin layer 22 and being incident on the light receiving element, and deterioration of image quality can be suppressed.

In addition, since the outer exposed area of the thin film joining resin layer 22 is reduced by the convex portion 51, entry of moisture is also suppressed and reliability (for example, moisture resistance) can be improved.

Furthermore, since the rigidity of the image sensor 20 is improved by the convex portion 51 as compared with a state in which the convex portion 51 is absent, warpage of the image sensor 20 can be suppressed.

When a plurality of image sensors 20 formed on the wafer are individually cut (diced), if cutting at a position at which the convex portion 51 is present, it is possible to prevent quality degradation of dicing due to processing of different materials.

Figure 13:
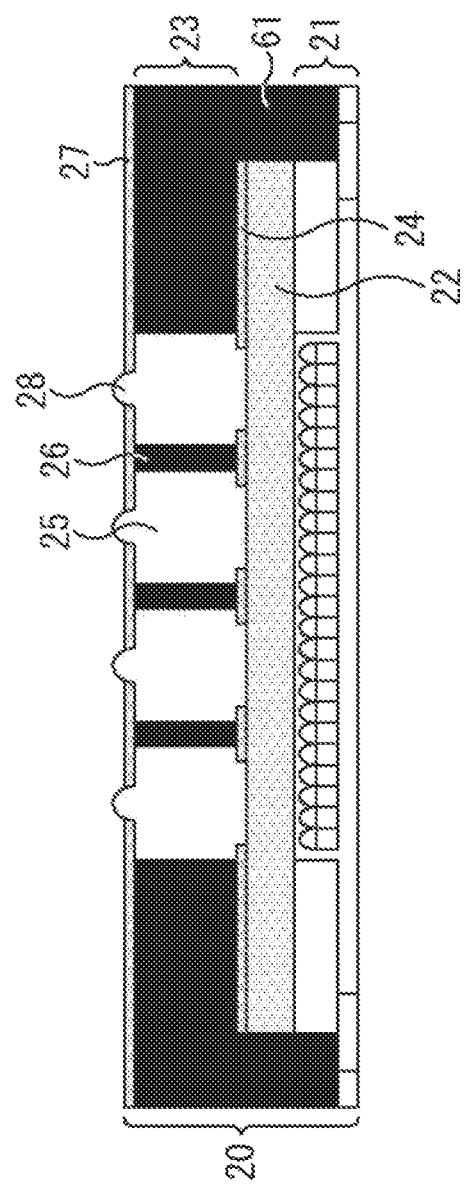
FIG. 13 is a cross-sectional view illustrating a fourth configuration example of the image sensor to which the present disclosure is applied.

Fourth Configuration Example of Image Sensor 20 which is Embodiment of Present Disclosure Next, FIG. 13 illustrates a fourth configuration example of the image sensor 20 that can prevent entry of light from the side of the thin film joining resin layer 22 having increased thickness.

In the fourth configuration example, the light shielding wall 26 of the light shielding body 23 at the end of the image sensor 20 extends to the side of the light receiving element layer 21 to form a convex portion 61.

The formation of the convex portion 61 is similar to that of the third configuration example. However, in the case of the fourth configuration example, it is also necessary to form the region of the light receiving element layer 21 joined with the convex portion 61 into a concave shape.

In the fourth configuration example, since the side of the joining resin layer 22 is shielded by the convex portion 61, it is possible to prevent light from entering from the side of the thin film joining resin layer 22 and being incident on the light receiving element, and the deterioration of the image quality can be suppressed.

In addition, since the outer exposed area of the thin film joining resin layer 22 is reduced by the convex portion 61, entry of moisture is also suppressed and reliability (for example, moisture resistance) can be improved.

Furthermore, since the rigidity of the image sensor 20 is improved by the convex portion 61 as compared with a state in which the convex portion 61 is absent, warpage of the image sensor 20 can be suppressed.

When the plurality of image sensors 20 formed on the wafer are individually cut (diced), if cutting at a position at which the convex portion 61 is present, it is possible to prevent the quality degradation of the dicing due to processing of different materials.

Figure 14:
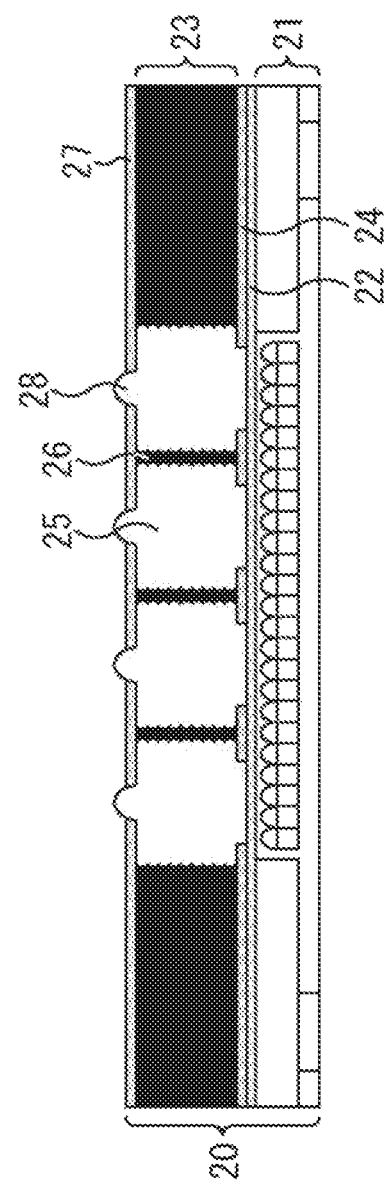
FIG. 14 is a cross-sectional view illustrating a fifth configuration example of the image sensor to which the present disclosure is applied.

Fifth Configuration Example of Image Sensor 20 which is Embodiment of Present Disclosure Next, FIG. 14 illustrates a fifth configuration example of the image sensor 20.

In the fifth configuration example, the light shielding wall 26 of the light shielding body 23 in the first configuration example of the image sensor 20 illustrated in FIG. 3 is formed in a moth eye structure having irregularities (non-flat surfaces). By making the light shielding wall 26 a moth eye structure in this manner, since the incident light incident on the light shielding wall 26 is scattered, the incident light incident on the light shielding wall 26 entering the light receiving element layer 21 can be reduced.

As a forming method of forming the light shielding wall 26 into a moth eye structure, for example, it is possible to use a Bosch process which repeats an isotropic etching step of isotropically etching the light shielding body 23 configured by a light shielding material such as Si, and an anisotropic etching step of forming a protective film on a front surface of the light shielding body 23 after the isotropic etching and then etching only a surface (a bottom surface) of the protective film in a depth direction.

Further, as illustrated in FIG. 15, the cross-sectional shape of the light shielding wall 26 having the moth eye structure may have an inversely tapered shape in which the opening portion on the lower side light shielding layer 24 side is larger than the opening portion on the upper side light shielding layer 27 side. This makes it possible to further reduce the incidence of the incident light, which is incident on the light shielding wall 26, into the light receiving element layer 21.

Further, although FIGS. 14 and 15 illustrate an example in which the light shielding wall 26 having the moth eye structure is applied to the first configuration example illustrated in FIG. 3, similarly, it can also be applied to the aforementioned second to fourth configuration examples.

Opening Shape of Upper Side Light Shielding Layer

FIGS. 16A and 16B are cross-sectional views, a plan view, and a perspective view illustrating the opening shapes of the upper side light shielding layer 27 and the lower side light shielding layer 24.

In the aforementioned first to fifth configuration examples, as illustrated in FIG. 16A, the description was provided on the assumption that the opening portion of the upper side light shielding layer 27 has a circular shape and the opening portion of the lower side light shielding layer 24 has a rectangular shape (a square shape).

However, as illustrated in FIG. 16B, the opening portion of the upper side light shielding layer 27 can be set to a rectangular shape (a square shape) similar to that of the opening portion of the lower side light shielding layer 24. In this case, the microlens 28 is formed on the upper side light shielding layer 27 with a larger diameter than the opening portion of the upper side light shielding layer 27.

In a case where the opening shape of the upper side light shielding layer 27 is circular, as illustrated in FIG. 16A, among the incident light having passed through the microlens 28, unnecessary light not incident on the light receiving element layer 21 is also incident on the vicinity of the opening portion of the lower side light shielding layer 24 indicated by hatching.

In contrast, in a case where the opening shape of the upper side light shielding layer 27 is a rectangle (square) which is the same as the opening shape of the variable light shielding layer 24, since unnecessary light is not incident as illustrated in FIG. 16B, it is possible to improve image quality.

Example of Application to Electronic Apparatus

The present technology is not limited to application to the image sensor. That is, the present technology is applicable to all electronic apparatuses which use a solid-state image pickup device as an image capturing unit (a photoelectric conversion unit), such as an image pickup device such as a digital still camera or a video camera, a portable terminal device having an image pickup function, or a copying machine which uses a solid-state image pickup device as an image reading unit. The solid-state image pickup device may be in a form formed as a single chip or may be in a modular form having an image pickup function in which an image pickup unit and a signal processing unit or an optical system are packaged together.

Figure 17:
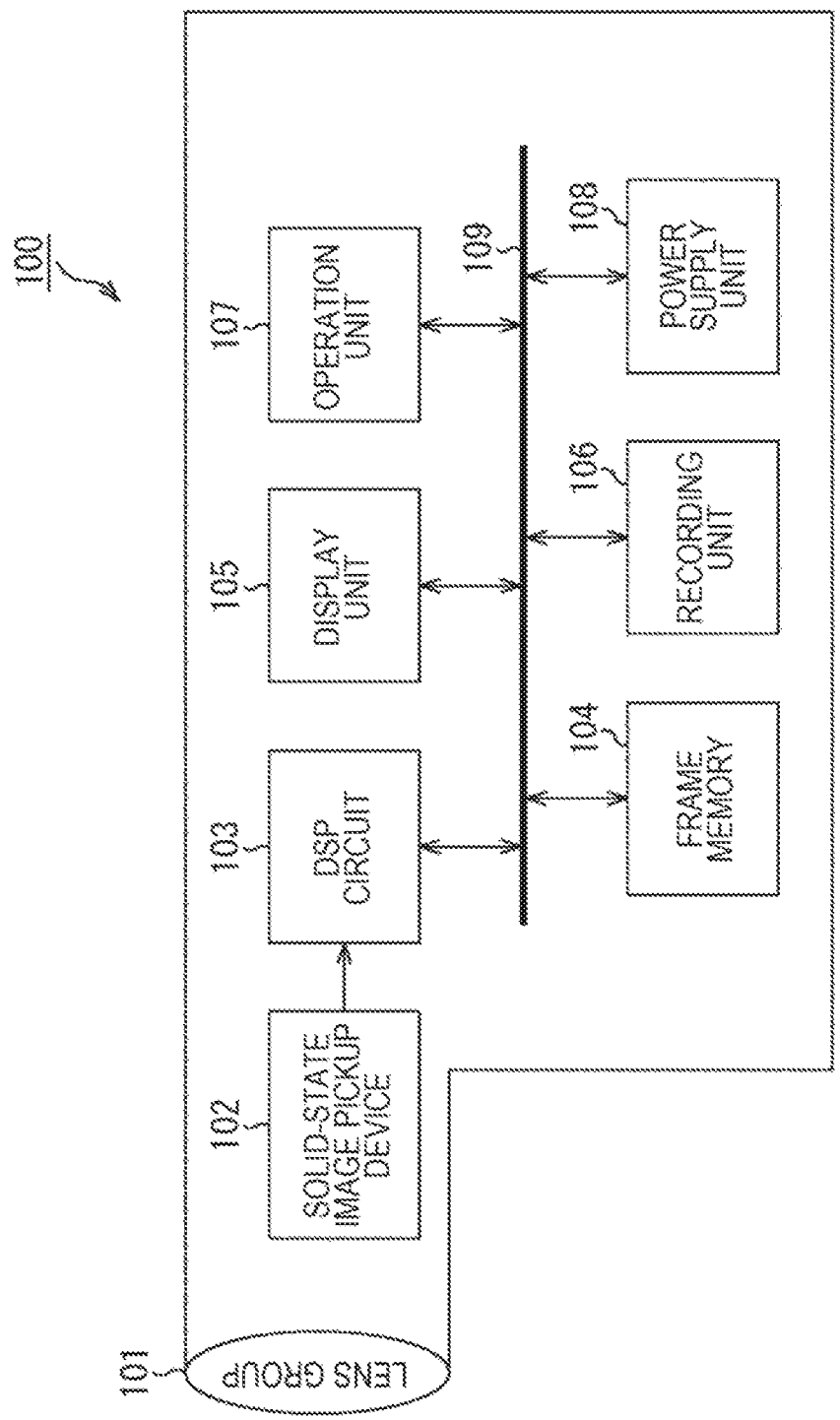
FIG. 17 is a block diagram illustrating a configuration example of an image pickup device as an electronic apparatus to which the present disclosure is applied.

FIG. 17 is a block diagram illustrating a configuration example of an image pickup device as an electronic apparatus to which the present technology is applied.

The image pickup device 100 of FIG. 17 includes an optical unit 101 including a lens group and the like, a solid-state image pickup device (an image pickup device) 102 in which the configuration of the image sensor 20 of the first to fifth configuration examples is adopted, and a digital signal processor (DSP) circuit 103 which is a camera signal processing circuit. Further, the image pickup device 100 is also equipped with a frame memory 104, a display unit 105, a recording unit 106, an operation unit 107, and a power supply unit 108. The DSP circuit 103, the frame memory 104, the display unit 105, the recording unit 106, the operation unit 107, and the power supply unit 108 are connected to each other via a bus line 109.

The optical unit 101 captures incident light (image light) from a subject and forms an image on the image pickup surface of the solid-state image pickup device 102. The solid-state image pickup device 102 converts the light amount of the incident light imaged on the image pickup surface by the optical unit 101 into electric signals in pixel units, and outputs the electric signals as pixel signals. As the solid-state image pickup device 102, it is possible to use any one of the image sensors 20 of the first to fifth configuration examples, that is, a solid-state image pickup device in which color mixture, stray light, and degradation of contour resolution are suppressed and the image quality is improved.

The display unit 105 includes, for example, a thin display such as a liquid crystal display (LCD) or an organic electro luminescence (EL) display, and displays a moving image or a still image captured by the solid-state image pickup device 102. The recording unit 106 records a moving image or a still image captured by the solid-state image pickup device 102 on a recording medium such as a hard disk or a semiconductor memory.

The operation unit 107 issues an operation command for various functions of the image pickup device 100 under the operation of the user. The power supply unit 108 appropriately supplies various power sources serving as operating power sources of the DSP circuit 103, the frame memory 104, the display unit 105, the recording unit 106, and the operation unit 107 to the supply targets.

As described above, by using any one of the image sensors 20 of the first to fifth configuration examples as the solid-state image pickup device 102, it is possible to suppress color mixture, stray light, and degradation of contour resolution. Therefore, even in the image pickup device 100 such as a video camera, a digital still camera, or a camera module for a mobile device such as a cellular phone, the image quality of the captured image can be improved.

Usage Example of Image Sensor

FIG. 18 is a diagram illustrating a usage example of the image sensor 20 described above.

The image sensor 20 can be used, for example, in various cases for sensing light such as visible light, infrared light, ultraviolet light, and X-rays as described below.

- A device for photographing an image to be used for viewing, such as a digital camera or a portable device with a camera function
- A device used for traffic, such as an in-vehicle sensor for photographing the front, rear, surroundings, interior of the car, and the like of automobiles for safe driving such as an automatic stop recognition of driver's conditions, and the like, a surveillance camera for monitoring traveling vehicles and roads, and a distance measuring sensor for measuring the distance between vehicles and the like
- A device used for home appliances such as a TV, a refrigerator, and an air conditioner to photograph the user's gesture and operate the device according to the gesture.
- A device used for medical care or healthcare, such as an endoscope or a device for performing angiography by receiving infrared light
- A device used for security, such as surveillance cameras for crime prevention purposes and cameras for person authentication use
- A device used for cosmetics, such as a skin measurer for photographing a skin and a microscope for photographing a scalp
- A device used for sports, such as an action camera and a wearable camera for sports applications and the like
- A device used for agriculture, such as a camera for monitoring the condition of fields and crops.

Further, the embodiments of the present disclosure are not limited to the above-described embodiments, and various modifications are possible within the scope that does not depart from the gist of the present disclosure.

The present disclosure can also take the following configurations.

(1)
A solid-state image pickup device including:
alight shielding body having light shielding walls and a light transmitting portion formed in an opening portion between the light shielding walls;
a first light shielding layer which is formed on an incident surface side of light of the light shielding body, and has an opening portion narrower than the opening portion of the light shielding body for each of the opening portions of the light shielding body;
a microlens provided on the incident surface side of light of the light shielding body and for each of the opening portions of the first light shielding layer;
a light receiving element layer in which a large number of light receiving elements which perform photoelectric conversion in accordance with incident light condensed by the microlens and input via the light transmitting portion of the light shielding body are arranged; and
a second light shielding layer which is formed on the light receiving element layer side of the light shielding body, and has an opening portion narrower than the opening portion of the light shielding body and wider than the first light shielding layer for each of the opening portions of the light shielding body.

(2)
The solid-state image pickup device according to (1), in which the light shielding wall of the light shielding body has a moth eye structure.

(3)
The solid-state image pickup device according to (2), in which the moth eye structure of the light shielding wall is formed by a Bosch process.

(4)
The solid-state image pickup device according to any of (1) to (3), in which a cross-sectional shape of the light shielding wall of the light shielding body is an inversely tapered shape.

(5)
The solid-state image pickup device according to any of (1) to (4), in which the opening portions of the first light shielding layer and the second light shielding layer have a rectangular shape.

(6)
The solid-state image pickup device according to any of (1) to (4), in which the opening portion of the first light shielding layer has a circular shape, and the opening portion of the second light shielding layer has a rectangular shape.

(7)
A method for manufacturing a solid-state image pickup device including:
forming a first light shielding layer having an opening portion narrower than an opening portion of a light shielding body for each of the opening portions of the light shielding body, on an incident surface side of light of the light shielding body having light shielding walls and a light transmitting portion formed in an opening portion between the light shielding walls;
forming a microlens on the incident surface side of light of the light shielding body and for each of the opening portions of the first light shielding layer; and
forming a second light shielding layer narrower than the opening portion of the light shielding body and wider than the first light shielding layer for each of the opening portions of the light shielding body, on the light receiving element layer side of the light shielding body.

(8)

An electronic apparatus including a solid-state image pickup device, the solid-state image pickup device including:
a light shielding body having light shielding walls and a light transmitting portion formed in an opening portion between the light shielding walls;
a first light shielding layer which is formed on an incident surface side of light of the light shielding body and has an opening portion narrower than the opening portion of the light shielding body for each of the opening portions of the light shielding body;
a microlens provided on the incident surface side of light of the light shielding body and for each of the opening portions of the first light shielding layer;
a light receiving element layer in which a large number of light receiving elements which perform photoelectric conversion in accordance with incident light condensed by the microlens and input via the light transmitting portion of the light shielding body are arranged; and
a second light shielding layer which is formed on the light receiving element layer side of the light shielding body, and has an opening portion narrower than the opening portion of the light shielding body and wider than the first light shielding layer for each of the opening portions of the light shielding body.

REFERENCE SIGNS LIST

20 Image sensor
21 Light receiving element layer
22 Thin film joining resin layer
23 Light shielding body
24 Lower side light shielding layer
25 Light transmitting portion
26 Light shielding wall
27 Upper side light shielding layer
28 Microlens
51 Convex portion
61 Convex portion
100 Image pickup device
102 Solid-state image pickup device

The invention claimed is:

1. A solid-state image pickup device, comprising:
a light shielding body that includes a plurality of light shielding walls and a plurality of light transmitting portions,
wherein each of the plurality of light transmitting portions is between corresponding light shielding walls of the plurality of light shielding walls;
an upper side light shielding layer on a light incident surface side of the light shielding body, wherein
the upper side light shielding layer includes a plurality of first opening portions on the plurality of light transmitting portions, and
each of the plurality of first opening portions is narrower than a corresponding light transmitting portion of the plurality of light transmitting portions;
a plurality of microlenses on the plurality of light transmitting portions, wherein
each of the plurality of microlenses is configured to condense light incident on the light incident surface side, and
each of the plurality of microlenses is in a corresponding first opening portion of the plurality of first opening portions;
a light receiving element layer that includes a plurality of light receiving elements configured to:
receive the condensed light via the plurality of light transmitting portions; and
execute photoelectric conversion based on the received; and
a lower side light shielding layer between the light receiving element layer and the light shielding body, wherein
the lower side light shielding layer includes a plurality of second opening portion,
each of the plurality of second opening portions is narrower than the corresponding light transmitting portion of the plurality of light transmitting portions,
each of the plurality of second opening portions is wider than the corresponding first opening portion of the plurality of first opening portions, and
the light shielding body is between the upper side light shielding layer and the lower side light shielding layer.

2. The solid-state image pickup device according to claim 1, wherein each of the plurality of light shielding walls of the light shielding body has a moth eye structure.

3. The solid-state image pickup device according to claim 2, wherein formation of the moth eye structure of each of the plurality of light shielding walls is based on a Bosch process.

4. The solid-state image pickup device according to claim 2, wherein a cross-sectional shape of each of the plurality of light shielding walls of the light shielding body is an inversely tapered shape.

5. The solid-state image pickup device according to claim 1, wherein
each of the plurality of first opening portions has a rectangular shape, and
each of the plurality of second opening portions has the rectangular shape.

6. The solid-state image pickup device according to claim 1, wherein
each of the plurality of first opening portions has a circular shape, and
each of the plurality of second opening portions has a rectangular shape.

7. A method for manufacturing a solid-state image pickup device, comprising:
forming an upper side light shielding layer on a light incident surface side of a light shielding body, wherein
the light shielding body includes a plurality of light shielding walls and a plurality of light transmitting portions,
the upper side light shielding layer includes a plurality of first opening portions on the plurality of light transmitting portions of the light shielding body,
each of the plurality of first opening portions is narrower than a corresponding light transmitting portion of the plurality of light transmitting portions, and
each of the plurality of light transmitting portions is between corresponding light shielding walls of the plurality of light shielding walls;
forming a plurality of microlenses on the plurality of light transmitting portions,
wherein each of the plurality of microlenses is formed in a corresponding first opening portion of the plurality of first opening portions; and
forming a lower side light shielding layer on a light receiving element layer side of the light shielding body, wherein
the light shielding body is between the upper side light shielding layer and the lower side light shielding layer, the lower side light shielding layer includes a plurality of second opening portions, each of the plurality of second opening portions is narrower than the corresponding light transmitting portion of the plurality of light transmitting portions, and each of the plurality of second opening portions is wider than the corresponding first opening portion of the plurality of first opening portions.

8. An electronic apparatus, comprising:

a solid-state image pickup device that includes:
  a light shielding body that includes a plurality of light shielding walls and a plurality of light transmitting portions,
    wherein each of the plurality of light transmitting portions is between corresponding light shielding walls of the plurality of light shielding walls;
  an upper side light shielding layer on a light incident surface side of the light shielding body, wherein
    the upper side light shielding layer includes a plurality of first opening portions on the plurality of light transmitting portions, and
    each of the plurality of first opening portions is narrower than a corresponding light transmitting portion of the plurality of light transmitting portions;
  a plurality of microlenses on the plurality of light transmitting portions, wherein
    each of the plurality of microlenses is configured to condense light incident on the light incident surface side, and
    each of the plurality of microlenses is in a corresponding first opening portion of the plurality of first opening portions;
  a light receiving element layer that includes a plurality of light receiving elements configured to:
    receive the condensed light via the plurality of light transmitting portions; and
    execute photoelectric conversion based on the received; and
  a lower side light shielding layer between the light receiving element layer and the light shielding body, wherein
    the lower side light shielding layer includes a plurality of second opening portion,
    each of the plurality of second opening portions is narrower than the corresponding light transmitting portion of the plurality of light transmitting portions,
    each of the plurality of second opening portions is wider than the corresponding first opening portion of the plurality of first opening portions, and
    the light shielding body is between the upper side light shielding layer and the lower side light shielding layer.

* * * * *